(12) United States Patent
Okubo et al.

(10) Patent No.: US 10,312,897 B2
(45) Date of Patent: Jun. 4, 2019

(54) SWITCHING DEVICE (71) Applicant: NISSAN MOTOR CO., LTD., Yokohama-shi, Kanagawa (JP)

(72) Inventors: Akinori Okubo, Kanagawa (JP); Throngnumchai Kraisorn, Kanagawa (JP); Kentaro Shin, Kanagawa (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 212 days.

(21) Appl. No.: 15/039,612

(22) PCT Filed: Nov. 6, 2014

(86) PCT No.: PCT/JP2014/079448
§ 371 (c)(1),
(2) Date: May 26, 2016

(87) PCT Pub. No.: WO2015/079882
PCT Pub. Date: Jun. 4, 2015

(65) Prior Publication Data
US 2017/0264279 A1 Sep. 14, 2017

(30) Foreign Application Priority Data
Nov. 29, 2013 (JP) ................................. 2013-247038

(51) Int. Cl.
*H03K 17/687* (2006.01)
*H03K 17/16* (2006.01)
(Continued)

(52) U.S. Cl.
CPC ....... *H03K 17/0412* (2013.01); *H03K 17/162* (2013.01)

(58) Field of Classification Search
CPC ............. H03K 17/0412; H03K 17/162; H03K 17/687; H03K 17/16; H02M 7/537
(Continued)

(56) References Cited

U.S. PATENT DOCUMENTS 5,055,721 A * 10/1991 Majumdar ......... H03K 17/0828
327/432
5,166,541 A * 11/1992 Mori ...................... H03K 17/08
327/379
(Continued)

FOREIGN PATENT DOCUMENTS

CN 1776830 A 5/2006
CN 2812397 Y 8/2006
(Continued)

*Primary Examiner* — Brandon S Cole
(74) *Attorney, Agent, or Firm* — Foley & Lardner LLP (57) ABSTRACT

A switching device according to the present invention comprises: a main circuit including a switching element; a control circuit which generates a control signal for switching the switching element between an on state and an off state; and a first signal line and a second signal line which transfer the control signal outputted from the control circuit, to the main circuit. The value of the characteristic impedance ($Z_{cd}$) of the first and second signal lines is set between the value of the output impedance ($Z_{ab}$) of the control circuit and the value of the input impedance ($Z_{ef}$) of the main circuit.

8 Claims, 9 Drawing Sheets

(51) Int. Cl.
*H03K 17/14* (2006.01)
*H02M 7/537* (2006.01)
*H02M 3/335* (2006.01)
*H03K 17/0412* (2006.01)

(58) Field of Classification Search
USPC .................................................. 327/365–508
See application file for complete search history.

(56) References Cited

U.S. PATENT DOCUMENTS

| | | | |
|---|---|---|---|
| 5,296,765 A * | 3/1994 | Williams | H03K 17/164 327/108 |
| 6,373,740 B1 | 4/2002 | Forbes et al. | |
| 6,577,178 B1 * | 6/2003 | Bernstein | H03K 19/00361 326/121 |
| 8,674,823 B1 * | 3/2014 | Contario | H02J 1/10 340/333 |
| 2003/0142569 A1 | 7/2003 | Forbes | |
| 2004/0222838 A1 * | 11/2004 | McCorquodale | G06G 7/122 327/347 |
| 2005/0040846 A1 | 2/2005 | Otsuka et al. | |
| 2007/0040184 A1 * | 2/2007 | Sugiyama | H01L 23/49844 257/133 |
| 2009/0206885 A1 * | 8/2009 | Sundblad | G11C 27/024 327/91 |
| 2009/0322557 A1 * | 12/2009 | Robb | G01M 5/0033 340/870.3 |
| 2013/0016548 A1 * | 1/2013 | Seki | H01L 24/32 363/131 |
| 2013/0278322 A1 * | 10/2013 | Choung | H03K 17/04123 327/382 |
| 2015/0207508 A1 * | 7/2015 | Wang | H03K 19/018507 327/333 |
| 2015/0318850 A1 * | 11/2015 | Hiyama | H03K 17/163 318/400.26 |
| 2016/0373017 A1 * | 12/2016 | Mima | H02J 9/06 |

FOREIGN PATENT DOCUMENTS

| | | |
|---|---|---|
| JP | 5-161343 A | 6/1993 |
| JP | 10-248237 A | 9/1998 |

* cited by examiner

SWITCHING DEVICE

TECHNICAL FIELD

The present invention relates to a switching device.

BACKGROUND ART

There has been proposed an invention relating to a power converting apparatus using a switching element capable of high-speed switching operation such as an insulated-gate bipolar transistor (IGBT) or an MOS field-effect transistor (MOSFET) (see Patent Literature 1). Patent Literature 1 discloses the controlling of gate voltage to be applied to the control terminal (gate terminal) of the switching element in order to solve technical problems originating from increase in speed of switching operation.

CITATION LIST

Patent Literature

Patent Literature 1: Japanese Patent Application Publication No. H 10-248237

SUMMARY OF INVENTION

In Patent Literature 1, in order to suppress increase in surge voltage due to high-speed switching, a gate resistor is provided on a signal line connected to the gate terminal to thereby keep the rate of change in gate voltage low. Consequently, the switching speed of the switching element is reduced.

The present invention has been made in view of the above problem, and an object thereof is to provide a switching device which reduces ringing noise due to reflection of a control signal while maintaining the switching speed of its switching element at high speed.

A switching device according to one aspect of the present invention comprises: a main circuit including a switching element; a control circuit which generates a control signal for switching the switching element between an on state and an off state; and a first signal line and a second signal line which transfer the control signal outputted from the control circuit, to the main circuit. The value of the characteristic impedance of the first and second signal lines is set between the value of the output impedance of the control circuit and the value of the input impedance of the main circuit.

BRIEF DESCRIPTION OF DRAWINGS

FIG. 5 Part (a) of FIG. 5 is a cross-sectional view taken along a cross-sectional plane A-A in FIG. 4, and Part (b) of FIG. 5 is a cross-sectional view of a switching device according to a modification of the second embodiment taken along the cross-sectional plane A-A.

FIG. 7 Part (a) of FIG. 7 is a cross-sectional view taken along a cross-sectional plane D-D in FIG. 6, and Part (b) of FIG. 7 is a cross-sectional view of a switching device according to a modification of the third embodiment taken along the cross-sectional plane D-D.

FIG. 8 Part (a) of FIG. 8 is a schematic view showing the configuration of a switching device according to a fourth embodiment, and Part (b) of FIG. 8 is a cross-sectional view taken along a cross-sectional plane B-B in Part (a) of FIG. 8.

FIG. 9 Part (a) of FIG. 9 is a schematic view showing the configuration of a switching device according to a fifth embodiment, and Part (b) of FIG. 9 is a cross-sectional view taken along a cross-sectional plane C-C in Part (a) of FIG. 9.

FIG. 13 Part (a) of FIG. 13 shows a graph showing ringing noise that appears on gate voltage (Vg), and Part (b) of FIG. 13 is a graph for describing advantageous effects by the first to sixth embodiments.

DESCRIPTION OF EMBODIMENTS

Embodiments of the present invention will be described with reference to the drawings. In the illustration of the drawings, identical portions will be denoted by identical reference signs, and description thereof will be omitted.

[First Embodiment]

The configuration of a switching device according to a first embodiment will be described with reference to FIG. 1. The switching device comprises: a main circuit 1 including a switching element; a control circuit 2 which generates a control signal for switching the switching element between an on state (conducting state) and an off state (non-conducting state); and a first signal line 3 and a second signal line 4 which transfer the control signal which is outputted from the control circuit 2, to the main circuit 1.

Figure 1:
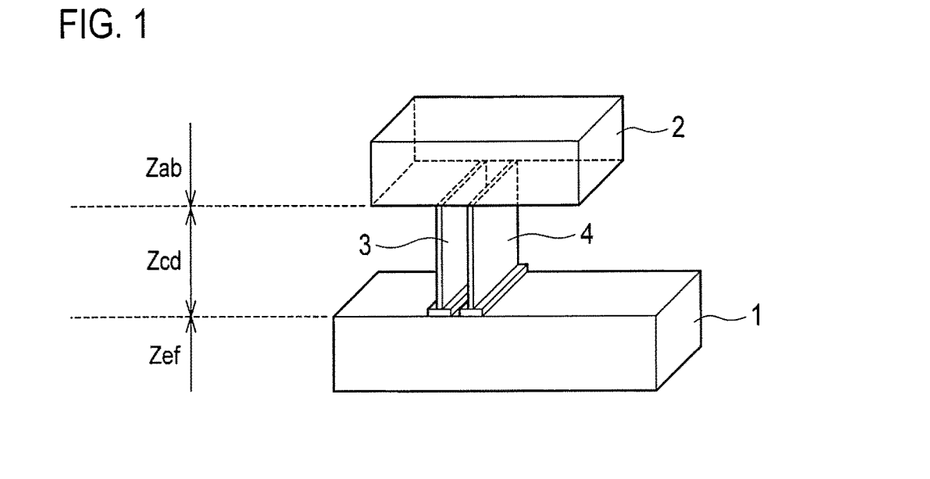
FIG. 1 is a schematic view showing the configuration of a switching device according to a first embodiment.

In FIG. 1, "$Z_{ab}$" indicates the value of the output impedance of the control circuit 2 which outputs the control signal, "$Z_{cd}$" indicates the value of the characteristic impedance of the first and second signal lines (3, 4) which transfer the control signal, and "$Z_{ef}$" indicates the value of the input impedance of the main circuit 1 to which the control signal is inputted.

Figure 2:
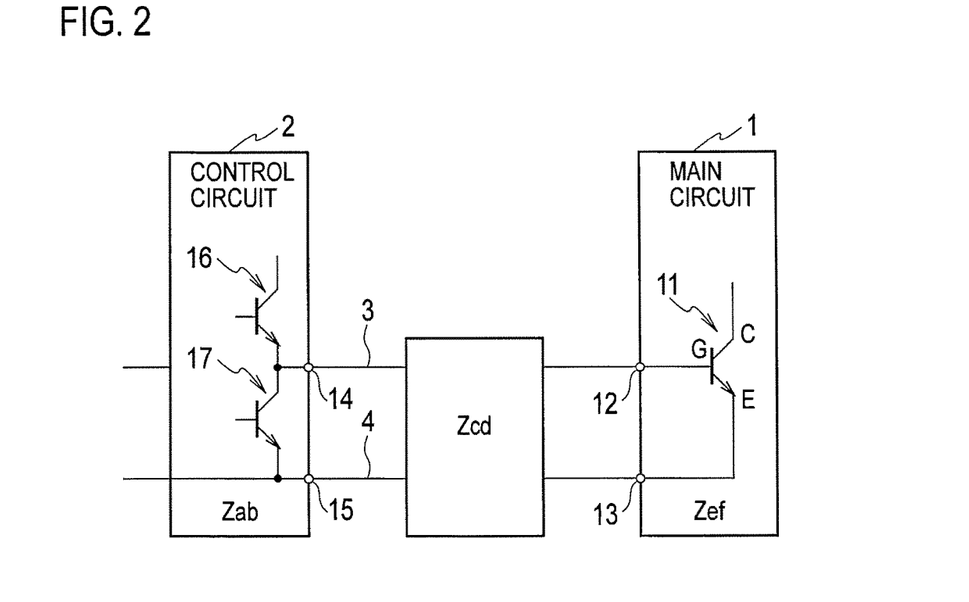
FIG. 2 is a conceptual diagram showing an example of the circuitry of a main circuit 1 and a control circuit 2, which are shown in FIG. 1, and characteristic impedance $Z_{cd}$ of first and second signal lines (3, 4).

An example of the circuitry of the main circuit 1 and the control circuit 2 and the impedances ($Z_{ab}$, $Z_{cd}$, $Z_{ef}$) will be described with reference to FIG. 2. A switching element 11 included in the main circuit 1 is, for example, a semiconductor element including an IGBT or MOSFET capable of high-speed switching operation. FIG. 2 exemplarily shows an IGBT including a collector electrode (C), an emitter electrode (E), and a gate electrode (G). The main circuit 1 further includes a first input terminal 12 connected to the gate electrode (G) and a second input terminal 13 connected to the emitter electrode (E). The main circuit 1 functions as switching means for performing switching operation with the switching element 11.

The control circuit 2 generates the control signal in two voltage levels to control two states (on state and off state) of the switching element 11 which is included in the main circuit 1. For example, the control circuit 2 generates, as the control signal, a potential difference (voltage level) between a node between two switching elements (16, 17) connected in series to each other and the other terminal of one of the switching elements, or the switching element 17. The control signal is generated in the different voltage levels in accordance with the on-off states of the switching elements (16, 17). The control circuit 2 includes a first output terminal 14 and a second output terminal 15 for outputting the generated control signal. The first output terminal 14 is connected to the node between the two switching elements (16, 17), and the second output terminal 15 is connected to the other terminal of the one switching element 17. The potential difference between the first output terminal 14 and the second output terminal 15 is outputted as the control signal. The control circuit 2 thus functions as controlling means for controlling the switching operation of the main circuit 1 with the control signal.

The first signal line 3 transfers the control signal by connecting the first output terminal 14 and the first input terminal 12 to each other. The second signal line 4 transfers the control signal by connecting the second output terminal 15 and the second input terminal 13 to each other. The first and second signal lines (3, 4) thus function as transferring means for transferring the control signal.

The output impedance ($Z_{ab}$) of the control circuit 2 which outputs the control signal, represents the impedance between the first output terminal 14 and the second output terminal 15. The input impedance ($Z_{ef}$) of the main circuit 1 to which the control signal is inputted, represents the impedance between the first input terminal 12 and the second input terminal 13.

<Reflection of Control Signal>

Next, reflection of the control signal will be described. The energy of the control signal as a traveling wave from the output impedance ($Z_{ab}$) to the characteristic impedance ($Z_{cd}$) is partially reflected at the portion where the impedance is discontinuous, and that reflection coefficient ($\rho_1$) is expressed by Formula (1). The reflection coefficient ($\rho_2$) for a traveling wave from the characteristic impedance ($Z_{cd}$) to the input impedance ($Z_{ef}$) can be expressed by Formula (1) as well.

[Math. 1]

$$\rho_1 = \frac{Z_{cd} - Z_{ab}}{Z_{cd} + Z_{ab}} \quad (1)$$

$$\rho_2 = \frac{Z_{ef} - Z_{cd}}{Z_{ef} + Z_{cd}}$$

The larger the absolute value of the reflection coefficient ($\rho_1$, $\rho_2$), the larger the reflected energy. For this reason, in this embodiment, the value of the characteristic impedance ($Z_{cd}$) of the first and second signal lines (3, 4) which transfer the control signal is adjusted to suppress the reflection of the control signal at each portion where the impedance is discontinuous.

The value of the characteristic impedance ($Z_{cd}$) of the first and second signal lines (3, 4) which transfer the control signal is adjusted and set between the value of the output impedance ($Z_{ab}$) of the control circuit 2 which outputs the control signal, and the value of the input impedance ($Z_{ef}$) of the main circuit 1 to which the control signal is inputted. In other words, the impedances $Z_{ab}$, $Z_{cd}$, and $Z_{ef}$ satisfy either Inequality (2) or Inequality (3).

[Math. 2]

$$Z_{ab} \leq Z_{cd} \leq Z_{ef} \quad (2)$$

[Math. 3]

$$Z_{ef} \leq Z_{cd} \leq Z_{ab} \quad (3)$$

The impedances $Z_{ab}$, $Z_{cd}$, and $Z_{ef}$ are expressed by Formula (4), Formula (5), and Formula (6), respectively, where $L_{ab}$, $L_{cd}$, and $L_{ef}$ are the inductance components of the impedances $Z_{ab}$, $Z_{cd}$, and $Z_{ef}$, $C_{ab}$, $C_{ad}$, and $C_{ef}$ are the capacitance components of the impedances $Z_{ab}$, $Z_{cd}$, and $Z_{ef}$, $R_{ab}$, $R_{cd}$, and $R_{ef}$ are the resistance components of the impedances $Z_{ab}$, $Z_{cd}$, and $Z_{ef}$, and $G_{ab}$, $G_{ad}$, and $G_{ef}$ are the admittance components of the impedances $Z_{ab}$, $Z_{cd}$, and $Z_{ef}$, respectively. Here, $\omega$ indicates the angular frequency of the alternating current.

[Math. 4]

$$Z_{ab} = \sqrt{\frac{R_{ab} + j\omega L_{ab}}{G_{ab} + j\omega C_{ab}}} \quad (4)$$

[Math. 5]

$$Z_{cd} = \sqrt{\frac{R_{cd} + j\omega L_{cd}}{G_{cd} + j\omega C_{cd}}} \quad (5)$$

[Math. 6]

$$Z_{ef} = \sqrt{\frac{R_{ef} + j\omega L_{ef}}{G_{ef} + j\omega C_{ef}}} \quad (6)$$

Here, in a comparison between the real parts (resistance components and admittance components) of the impedances $Z_{ab}$, $Z_{cd}$, and $Z_{ef}$, the real parts ($R_{cd}$, $G_{cd}$) of the characteristic impedance $Z_{cd}$ are generally small enough to be negligible as compared to the real parts ($R_{ab}$, $G_{ab}$, $R_{ef}$, $G_{ef}$) of the output impedance $Z_{ab}$ and the input impedance $Z_{ef}$. The characteristic impedance $Z_{cd}$ of the first and second signal lines (3, 4) can then be approximated as shown in Formula (7). That is, when designing the configurations of the first and second signal lines (3, 4), one should take only the imaginary parts (inductance component $L_{cd}$ and capacitance component $C_{cd}$) of the characteristic impedance $Z_{cd}$ into consideration.

[Math. 7]

$$Z_{cd} \approx \sqrt{\frac{L_{cd}}{C_{cd}}} \quad (7)$$

The inductance component $L_{cd}$ of the characteristic impedance $Z_{cd}$ is expressed by Formula (8) using self-inductance Lo and mutual inductance Mo.

[Math. 8]

$$L_{cd} = 2(L_o + M_o) \quad (8)$$

Figure 3:
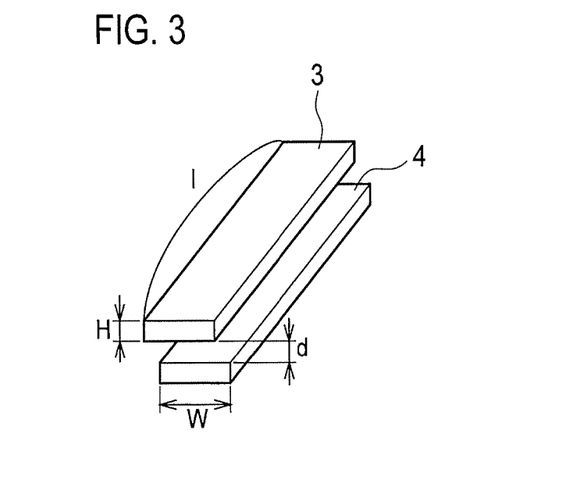
FIG. 3 is a perspective view showing the dimensions of the first and second signal lines (3, 4).

Meanwhile, the self-inductance Lo and the mutual inductance Mo are approximated by Formula (9) and Formula (10), respectively, in a case where the first and second signal lines (3, 4) are formed of flat plates parallel to each other. As shown in FIG. 3, the length, width, and height of each of the first and second signal lines (3, 4) is l, w, and H, respectively, and the distance between the first signal line 3 and the second signal line 4 is d.

[Math. 9]
$$L_o \approx \frac{\mu_0 l}{2\pi}\left[\ln\left(\frac{2l}{w+H}\right) + \frac{1}{2} + \frac{0.2235(w+H)}{l}\right] \quad (9)$$

[Math. 10]
$$M_o \approx \frac{\mu_0 l}{2\pi}\left[\ln\left(\frac{2l}{d}\right) - 1 + \frac{d}{l}\right] \quad (10)$$

On the other hand, the capacitance component $C_{cd}$ of the characteristic impedance $Z_{cd}$ is approximated by Formula (11), where $\varepsilon_r$ is relative permittivity between the first signal line 3 and the second signal line 4, $\varepsilon_0$ is vacuum permittivity, and S is the area of the mutually facing surfaces of the first signal line 3 and the second signal line 4. Note that in the first embodiment, air is filled between the first and second signal lines (3, 4), and thus the relative permittivity $\varepsilon_r$ is the relative permittivity of air.

[Math. 11]
$$C_{cd} \approx \varepsilon_0 \varepsilon_r \frac{S}{d} \quad (11)$$

As described above, the characteristic impedance $Z_{cd}$ which is calculated from Formula (7) to Formula (11) is matched to the output impedance $Z_{ab}$ and the input impedance $Z_{ef}$ which are calculated from Formula (4) and Formula (6), such that the absolute values of the reflection coefficients ($\rho_1$, $\rho_2$) which are shown in Formula (1) can be small. Specifically, the characteristic impedance $Z_{cd}$ is adjusted to satisfy Inequality (2) or Inequality (3). For example, in the case where the first and second signal lines (3, 4) are formed of flat plates parallel to each other, the characteristic impedance $Z_{cd}$ may be adjusted using the length (l), width (w), and height (H) of each of the first and second signal lines (3, 4), the distance (d) between the first signal line 3 and the second signal line 4, and the area (S) of the mutually facing surfaces of the first signal line 3 and the second signal line 4.

Satisfying Inequality (2) or Inequality (3) can suppress the impedance discontinuity between the control circuit 2 and the first and second signal lines (3, 4) and between the first and second signal lines (3, 4) and the main circuit 1 and thus make the absolute values of the reflection coefficients ($\rho_1$, $\rho_2$) small. This makes it possible to suppress ringing due to the reflection of the control signal between the two terminals (12, 13) of the main circuit 1, and also achieve high-speed performance. Hence, the switching loss can be reduced.

Satisfying Inequality (2) or Inequality (3) makes the difference between the output impedance ($Z_{ab}$) and the characteristic impedance ($Z_{cd}$) small and makes the difference between the characteristic impedance ($Z_{cd}$) and the input impedance ($Z_{ef}$) small. This makes it possible to suppress the reflection of the control signal at the nodes between the control circuit 2 and the first and second signal lines (3, 4) and the reflection of the control signal at the nodes between the first and second signal lines (3, 4) and the main circuit 1. Thus, the ringing noise due to the reflection of the control signal can be reduced with the switching speed of the switching element maintained at high speed. Hence, it is possible to reduce the switching loss of the switching element and also suppress erroneous operation of the switching element.

In the case where the first and second signal lines (3, 4) are formed of flat plates parallel to each other, the capacitance component ($C_{cd}$) of the pair of signal lines can be easily controlled by adjusting the area (S) of and the distance (d) between the mutually facing first and second signal lines (3, 4). Thus, forming the first and second signal lines (3, 4) with flat plates parallel to each other makes it possible to easily control the characteristic impedance $Z_{cd}$ through adjustment of the parameters (l, w, H, d, S) of the first and second signal lines (3, 4).

[Second Embodiment]

Figure 4:
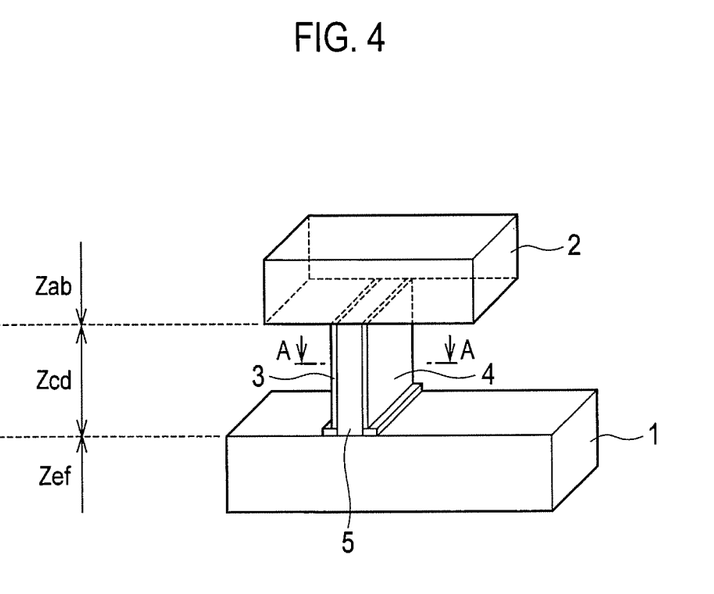
FIG. 4 is a schematic view showing the configuration of a switching device according to a second embodiment.
Figure 5:
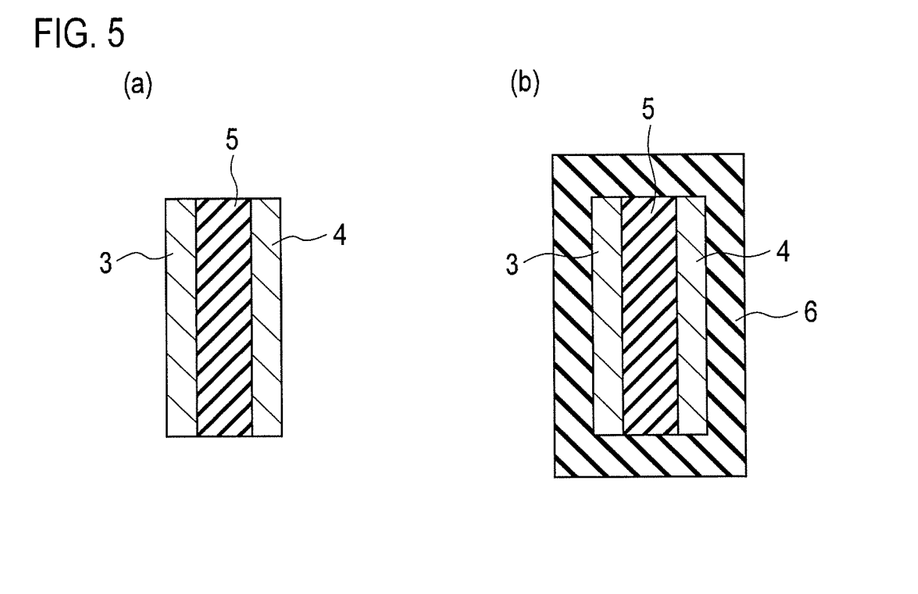

As shown in FIG. 4 and Part (a) of FIG. 5, a switching device according to a second embodiment further comprises a dielectric body 5 disposed between first and second signal lines (3, 4). In the first embodiment, the relative permittivity ($\varepsilon_r$) is the relative permittivity of air since air is filled between the first and second signal lines (3, 4). In the second embodiment, the dielectric body 5 which is higher in relative permittivity than air is provided between the first and second signal lines (3, 4). In this way, the capacitance component $C_{cd}$ which is shown in Formula (11) is increased. Hence, the characteristic impedance $Z_{cd}$ can be reduced to satisfy Inequality (2) or Inequality (3).

Note that as shown in Part (b) of FIG. 5, the peripheries of the first and second signal lines (3, 4) with the dielectric body 5 sandwiched therebetween may be covered with resin 6. In this way, the mechanical strength of the first and second signal lines (3, 4) with the dielectric body 5 sandwiched therebetween can be enhanced. Here, the peripheries of the first and second signal lines (3, 4) with air filled therebetween as shown in the first embodiment may be covered with the resin 6.

[Third Embodiment]

Figure 6:
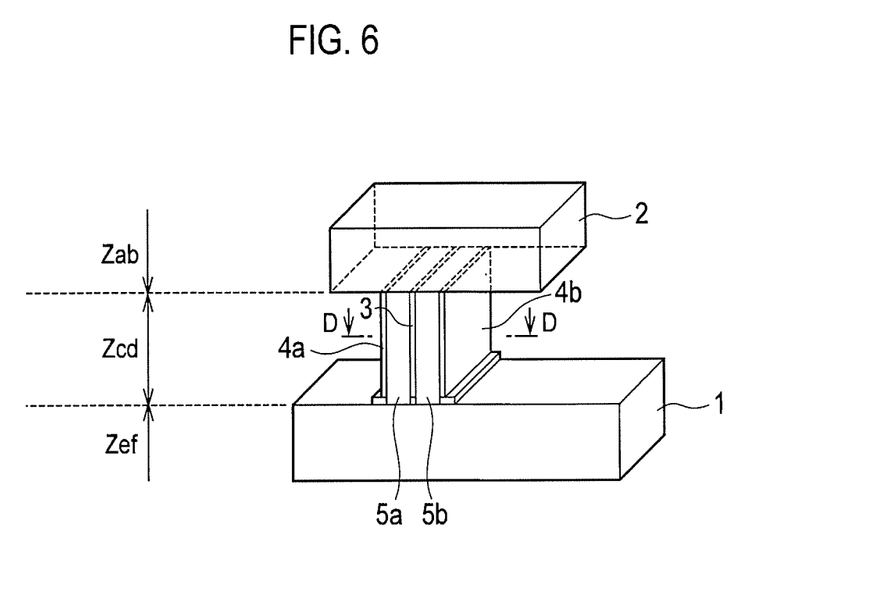
FIG. 6 is a schematic view showing the configuration of a switching device according to a third embodiment.
Figure 7:
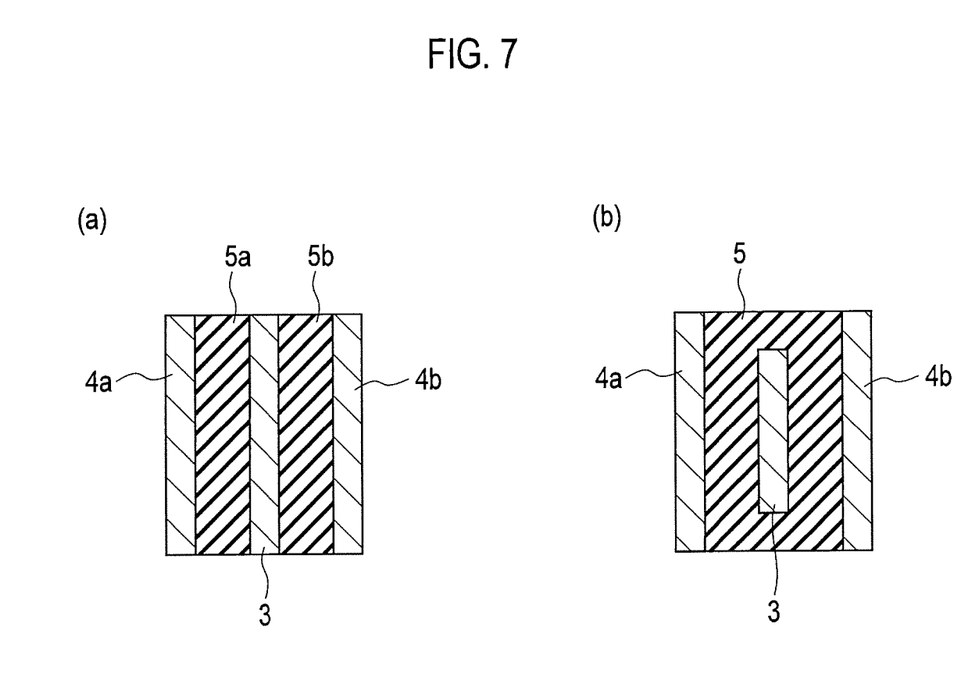

As shown in FIG. 6 and Part (a) of FIG. 7, a switching device according to a third embodiment comprises one first signal line 3 and two second signal lines (4a, 4b), and the first signal line 3 is disposed between the two second signal lines (4a, 4b). Dielectric bodies (5a, 5b) are disposed between the first signal line 3 and the second signal lines (4a, 4b), respectively. In this way, a capacitance component $C_{cd}$ between the first and second signal lines (3, 4a, 4b) is increased. Hence, characteristic impedance $Z_{cd}$ of the first and second signal lines (3, 4a, 4b) can be reduced.

Note that the first signal line 3 and the two second signal lines (4a, 4b) shown in Part (a) of FIG. 7 have an equal width. Alternatively, as shown in Part (b) of FIG. 7, the width (w) of the first signal line 3 may be smaller than the width of each second signal line (4a, 4b), for example. In this case, in the cross section shown in Part (b) of FIG. 7, the first signal line 3 with its periphery covered with a dielectric body 5 is sandwiched between the two second signal lines (4a, 4b). Hence, the mechanical strength of the signal lines (3, 4a, 4b) as a whole can be enhanced. Here, instead of the dielectric body 5, air may be filled between the first signal line 3 and the second signal lines (4a, 4b).

[Fourth Embodiment]

Figure 8:
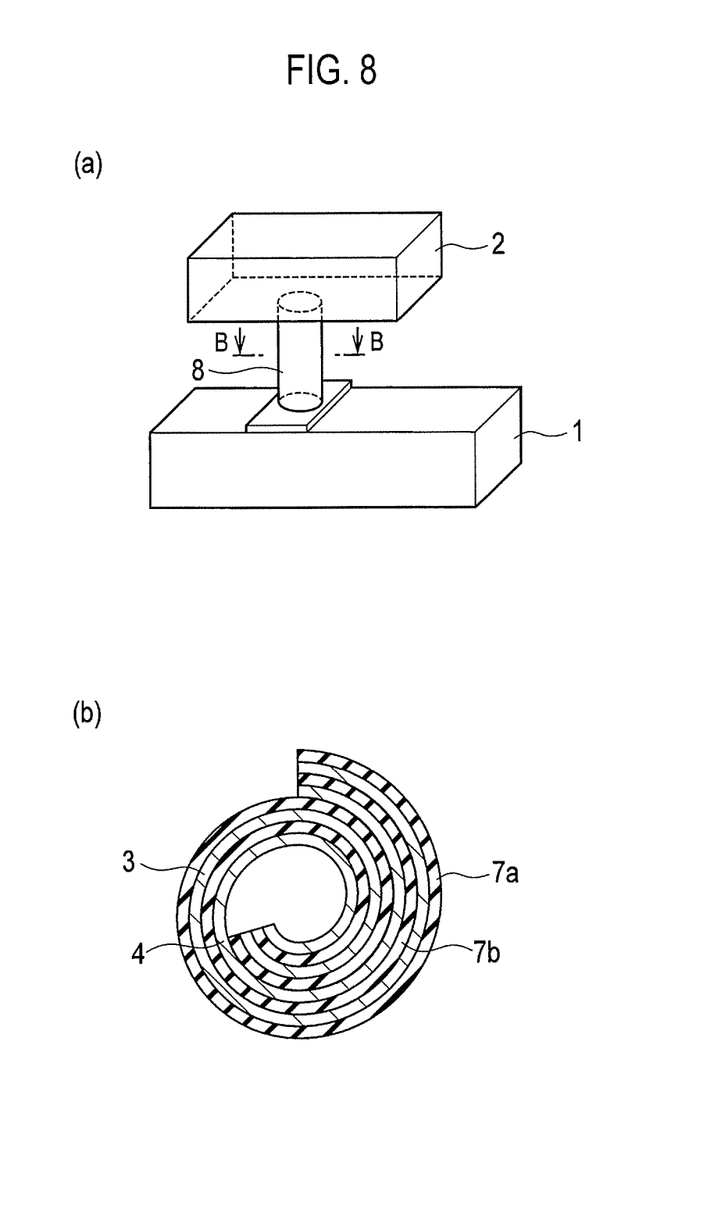

As shown in Part (a) of FIG. 8 and Part (b) of FIG. 8, a switching device according to a fourth embodiment further comprises insulating bodies (7a, 7b) disposed between first and second signal lines (3, 4). The first and second signal lines (3, 4) each have a plate shape and are rolled in a state where the insulating bodies (7a, 7b) and the first and second signal lines (3, 4) are superposed one on another. Thus, a signal line 8 as a whole has a cylindrical shape. Then, a capacitance component $C_{cd}$ between the first and second signal lines (3, 4) is increased, and an inductance component $L_{cd}$ is reduced. Hence, characteristic impedance $Z_{cd}$ of the first and second signal lines can be reduced.

[Fifth Embodiment]

Figure 9:
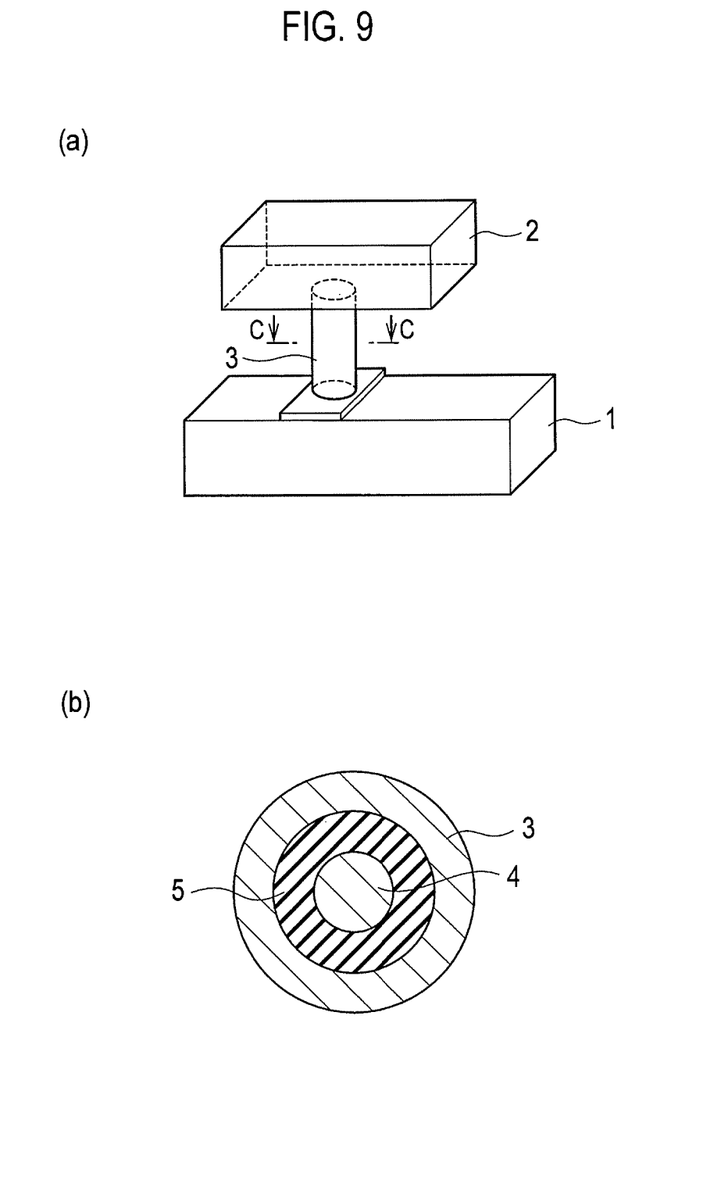

As shown in Part (a) of FIG. 9 and Part (b) of FIG. 9, in a switching device according to a fifth embodiment, a first signal line 3 is disposed to surround a second signal line 4. Specifically, the second signal line 4 has a solid cylindrical shape while the first signal line 3 has a hollow cylindrical shape. The inner diameter of the first signal line 3 is larger than the outer diameter of the second signal line 4. The second signal line 4 is disposed inside the first signal line 3, and a dielectric body 5 is disposed between the second signal line 4 and the first signal line 3.

With the first signal line 3 disposed to surround the second signal line 4, a capacitance component $C_{cd}$ between the first and second signal lines (3, 4) is increased. Hence, characteristic impedance $Z_{cd}$ of the first and second signal lines (3, 4) can be reduced. Here, instead of disposing the dielectric body 5, air may be filled between the first and second signal lines (3, 4).

[Sixth Embodiment]

Figure 10:
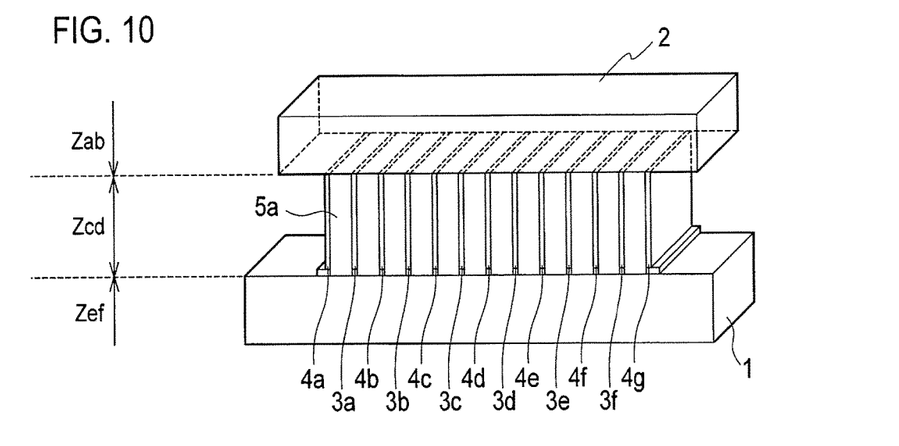
FIG. 10 is a schematic view showing the configuration of a switching device according to a sixth embodiment.

As shown in FIG. 10, in a switching device according to a sixth embodiment, a main circuit 1 includes a plurality of switching elements, and a plurality of first and second signal lines (3a, 3b, 3c, . . . , 3f, 4a, 4b, 4c, . . . , 4g) are provided to transfer a control signal to each of the plurality of switching elements. The first and second signal lines (3a to 3f, 4a to 4g) are alternately arranged, and a dielectric body (5a, . . . ) is disposed between the first and second signal lines. In this way, a capacitance component $C_{cd}$ between the first and second signal lines (3a to 3f, 4a to 4g) can be increased. Hence, characteristic impedance $Z_{cd}$ of the first and second signal lines (3a to 3f, 4a to 4g) can be reduced.

Figure 11:
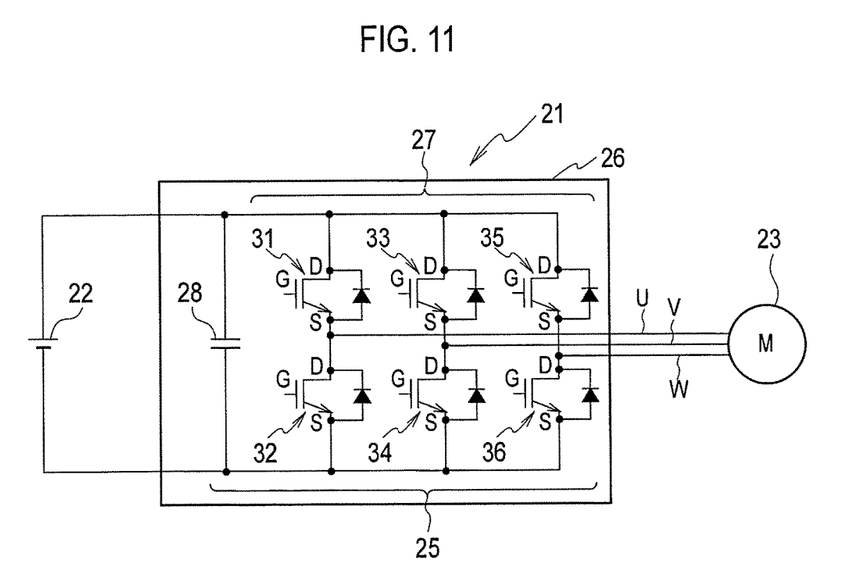
FIG. 11 is a circuit diagram showing an example of application of the switching device in FIG. 10 to a power converting apparatus.
Figure 12:
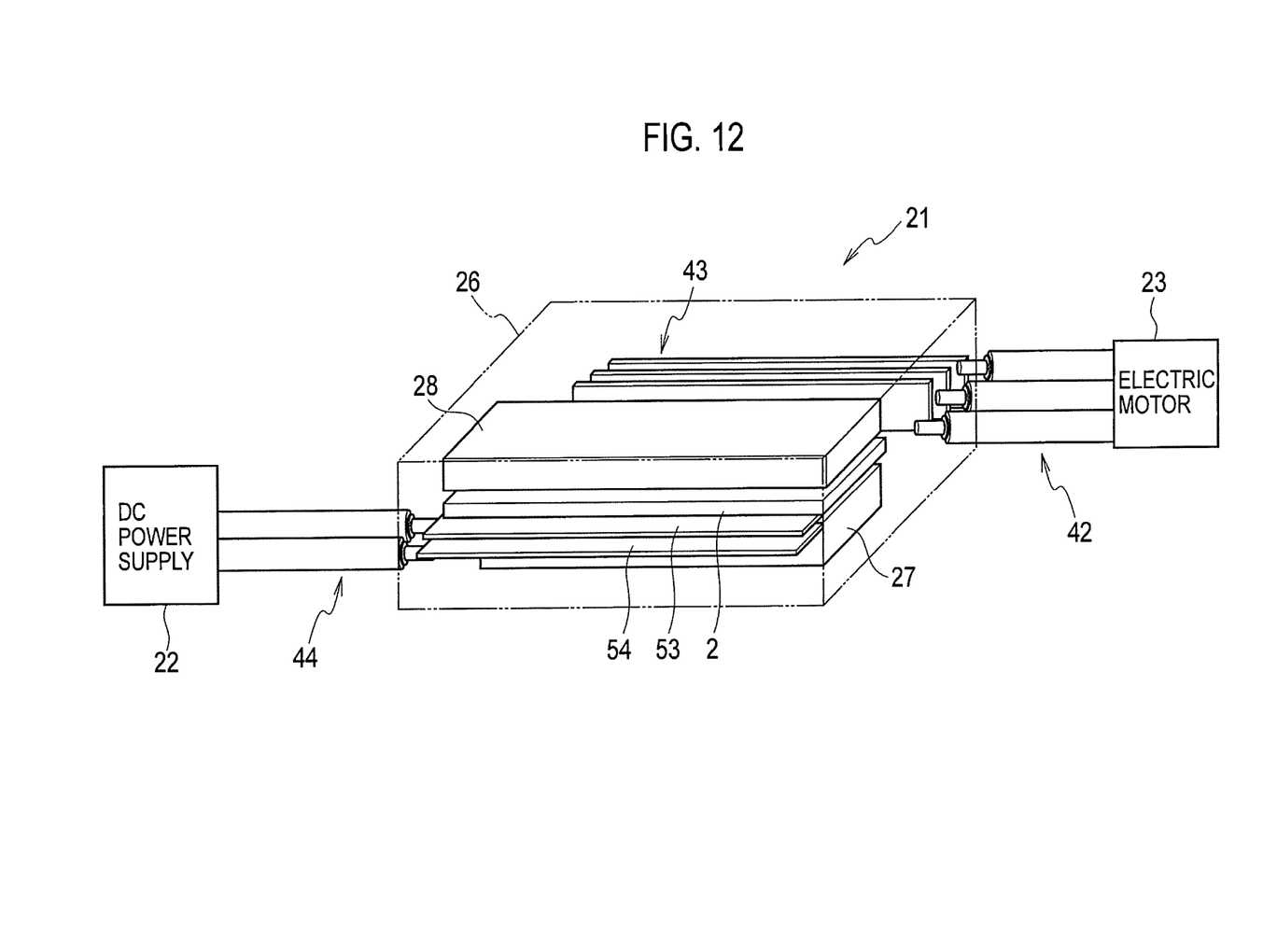
FIG. 12 is a schematic view showing the example of application of the switching device in FIG. 10 to the power converting apparatus.

The switching device according to the sixth embodiment can be applied for example to a power converting apparatus 21 which converts DC power outputted from a DC power supply 22 such as a secondary battery into AC power, as shown in FIG. 11 and FIG. 12. The power converting apparatus 21 includes: a power module 25 formed of an inverter 27 which converts the DC power into three-phase AC power and a smoothing capacitor 28 which absorbs fluctuations in the DC voltage to be inputted into the inverter 27; and a metal housing 26 storing the power module 25. The inverter 27 includes a plurality of switching elements (31 to 36) capable of high-speed switching operation. The inverter 27 includes two switching element for each of the three phases (U phase, V phase, W phase), the two switching elements connected in series to each other and constituting upper and lower arms. The inverter 27 is connected in parallel to the DC power supply 22 and the smoothing capacitor 28 by first and second power-feed bus lines.

The three-phase AC power which is obtained by the conversion by the inverter 27 is fed to an electric motor 23 such as a three-phase AC electric motor. The power converting system shown in FIG. 11 and FIG. 12 can be applied to a vehicle that travels with the electric motor 23 as a drive source for travel, i.e. an electric vehicle or hybrid vehicle (HEV) with the output shaft of the electric motor 23 coupled to the vehicle's axle.

As shown in FIG. 12, the output terminals of the DC power supply 22 are connected to first and second power-feed bus lines 53, 54 in the metal housing 26 by a pair of shield lines 44. The control circuit 2 is stored in the metal housing 26 and connected to the plurality of switching elements (31 to 36) by the first and second signal lines, which are not shown. The output terminals of the inverter 27 are connected to three shield lines 42 by bus bars 43 disposed in the metal housing 26. The three shield lines 42 are connected to the input terminals of the electric motor 23. Thus, the three-phase AC power which is obtained by the conversion by the inverter 27 is outputted to the electric motor 23 through the bus bars 43 and the shield lines 42. Note that the shield lines 42, 44 are each an electric line formed by coating a metal line with resin. As described above, the switching device according to this embodiment can be applied to the inverter 27 which feeds AC power to the electric motor 23 such as a three-phase AC electric motor.

[Switching Loss]

Figure 13:
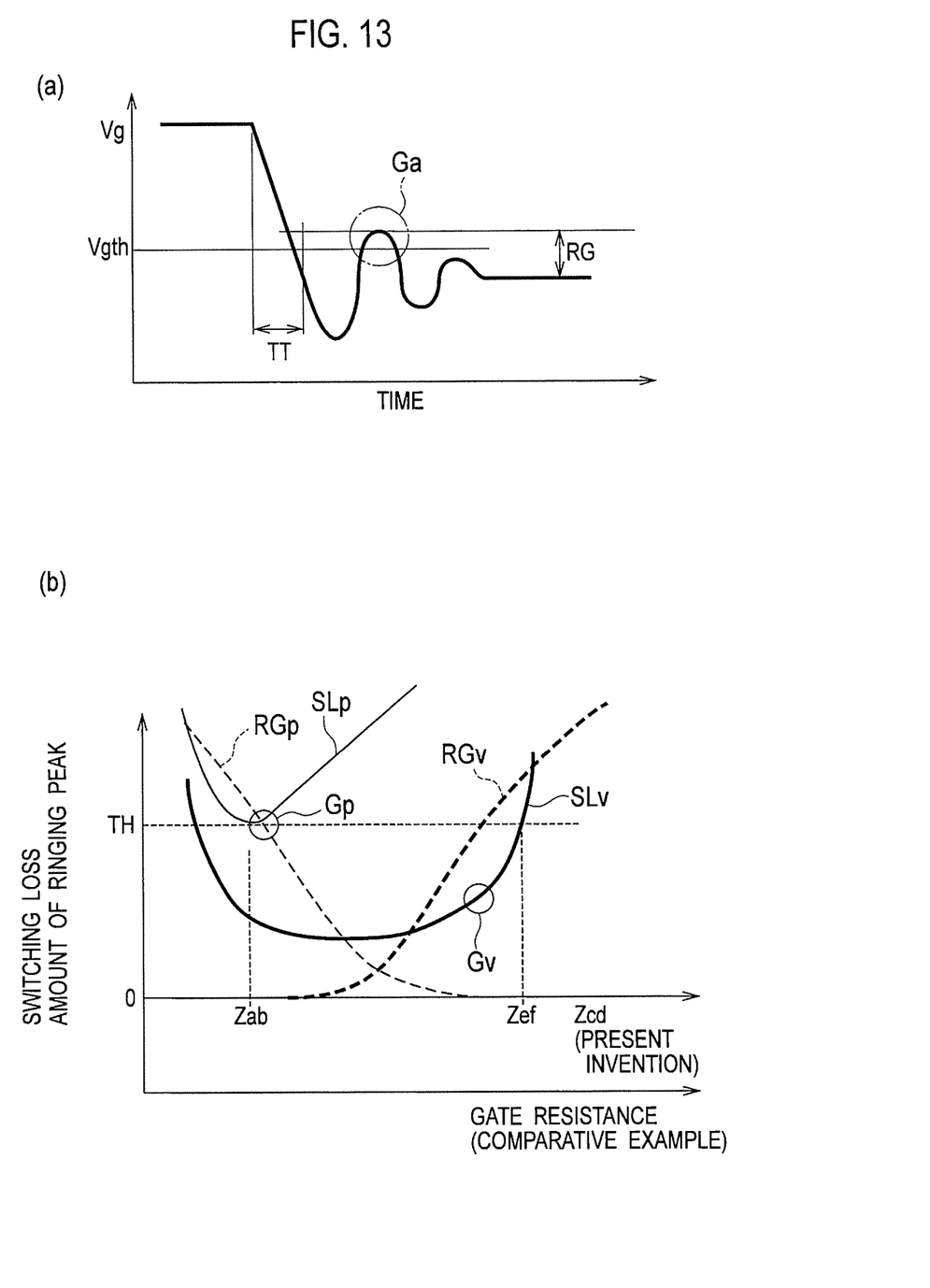

As shown in Part (a) of FIG. 13, when gate voltage (Vg) which forms the control signal shifts from a high-potential state to a low-potential state by spending a predetermined transition time TT, so-called ringing noise occurs in which the gate voltage vibrates. If the ringing noise causes the gate voltage to vibrate across the switching threshold (Vgth) of the switching element, erroneous operation Ga will occur between the on state and the off state. By lowering an amount of ringing peak RG shown in FIG. 13 to such an extent that it does not exceed the switching threshold (Vgth), the erroneous operation Ga is prevented.

The vertical axis in Part (b) of FIG. 13 indicates the amount of ringing peak (RGp) and the switching loss (SLp) in a comparative example in which a gate resistor is provided on a signal line connected to the control terminal (gate terminal) of a switching element, and the amount of ringing peak (RGv) and the switching loss (SLv) in any of the foregoing embodiments of the present invention, in which no gate resistor is provided. The horizontal axis in Part (b) of FIG. 13 indicates the gate resistance in the comparative example and the characteristic impedance $Z_{cd}$ of the first and second signal lines (3, 4) in the embodiment of the present invention.

In the comparative example, the larger the gate resistance, the smaller the amount of ringing peak (RGp). This is because the larger the gate resistance, the lower the switching speed and the longer the transition time TT and therefore the smaller the ringing noise. However, if the gate resistance is so small that the amount of ringing peak (RGp) is larger than a threshold TH for the occurrence of the erroneous operation Ga, the switching loss (SLp) in the comparative example rapidly increases due to the erroneous operation Ga. Even in a range where the amount of ringing peak (RGp) is smaller than the threshold TH, the switching loss (SLp) in the comparative example increases with increase in gate resistance.

In contrast, the amount of ringing peak (RGv) in the embodiment starts increasing with increase in characteristic impedance $Z_{cd}$ while the characteristic impedance $Z_{cd}$ satisfies Inequality (2) or Inequality (3). Even if the characteristic impedance $Z_{cd}$ further increases and stops satisfying Inequality (2) or Inequality (3), the amount of ringing peak (RGv) continues to increase further. The switching loss (SLv) in the embodiment remains low while the characteristic impedance $Z_{cd}$ satisfies Inequality (2) or Inequality (3), but rapidly increases once the characteristic impedance $Z_{cd}$ stops satisfying Inequality (2) or Inequality (3).

A comparison is made between switching losses (Gp, Gv) obtained when the gate resistance in the comparative example and the characteristic impedance $Z_{cd}$ in the embodiment are adjusted such that the amounts of ringing peak (RGp, RGv) in the comparative example and the embodiment are at the threshold TH. As compared to the switching loss (Gp) in the comparative example, the switching loss (Gv) in the embodiment can be reduced by 30% or more. Thus, it is possible to suppress the erroneous operation of the switching element and also reduce the switching loss of the switching element even without providing a gate resistor on the signal line connected to the control terminal of the switching element as in the conventional practice.

Although the first to sixth embodiments of the present invention have been described above, it should not be understood that the statement and the drawings constituting part of this disclosure limit this invention. Various alternative embodiments, examples, and operation techniques will become apparent to those skilled in the art from this disclosure.

In the first embodiment, it has been mentioned that, as shown in Formula (7), the real parts of the characteristic impedance $Z_{cd}$ of the first and second signal lines (3, 4) may be ignored and only its imaginary parts (inductance component $L_{cd}$ and capacitance component $C_{cd}$) may be taken into consideration. This brings about an advantage that the designing of the characteristic impedance $Z_{cd}$ is easier.

Furthermore, the characteristic impedance $Z_{cd}$ may be designed by ignoring the inductance component $L_{cd}$ and taking only the capacitance component $C_{cd}$ into consideration. In a case where the length (l) of each of the first and second signal lines (3, 4) is sufficiently large relative to the distance (d), the rate of change in the capacitance component ($C_{cd}$) between the first bus line and the second bus line is dominant over the rate of change in the inductance component ($L_{cd}$) which is shown in Formula (8) to Formula (10). Then, by ignoring the inductance component ($L_{cd}$) and taking only the capacitance component ($C_{cd}$) into consideration, the characteristic impedance $Z_{cd}$ can be designed more easily.

This application claims priority to Japanese Patent Application No. 2013-247038 filed on Nov. 29, 2013, the entire content of which is incorporated herein by reference.

REFERENCE SIGNS LIST 1 main circuit
2 control circuit
3 first signal line
4 second signal line
5 dielectric body
6 resin
1 1switching element
Zab output impedance
Zcd characteristic impedance
Zef input impedance

The invention claimed is:

1. A switching device comprising:
a main circuit including a switching element;
a control circuit which generates a control signal for switching the switching element between an on state and an off state; and
a first signal line and a second signal line which transfer the control signal outputted from the control circuit, to the main circuit, wherein
a value of characteristic impedance of the first and second signal lines which transfer the control signal is set between a value of output impedance of the control circuit which outputs the control signal and a value of input impedance of the main circuit to which the control signal is inputted.

2. The switching device according to claim 1, wherein the first and second signal lines are formed of flat plates parallel to each other.

3. The switching device according to claim 1, wherein the second line includes two signal lines, and the first signal line is disposed between the two signal lines of the second signal line.

4. The switching device according to claim 1, wherein the first signal line is disposed to surround the second signal line.

5. The switching device according to claim 1, further comprising a dielectric body disposed between the first signal line and second signal line.

6. The switching device according to claim 1, further comprising
an insulating body disposed between the first signal line and the second signal line, wherein
the first and second signal lines each have a plate shape and are rolled in a state where the insulating body and the first and second signal lines are superposed one on another.

7. The switching device according to claim 1, wherein at least one of the first signal line or the second signal line is covered with resin.

8. The switching device according to claim 1, wherein
the main circuit includes a plurality of switching elements,
the first and second signal lines are a plurality of signal lines provided to transfer the control signal to each of the plurality of switching elements, and
the first and second signal lines are alternately arranged, and a dielectric body is disposed between the first signal line and second signal line.

* * * * *